United States Patent
Kim et al.

(10) Patent No.: US 10,877,521 B2
(45) Date of Patent: Dec. 29, 2020

(54) DISPLAY DEVICE

(71) Applicant: SAMSUNG DISPLAY CO., LTD., Yongin-si (KR)

(72) Inventors: Hyo Jung Kim, Suwon-si (KR); Tae Young Kim, Seongnam-si (KR); Jong Woo Park, Seongnam-si (KR); Dae Youn Cho, Yongin-si (KR); Ki Ju Im, Suwon-si (KR); Young Tae Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/408,953

(22) Filed: May 10, 2019

(65) Prior Publication Data

US 2020/0033914 A1 Jan. 30, 2020

(30) Foreign Application Priority Data

Jul. 30, 2018 (KR) ........................ 10-2018-0088583

(51) Int. Cl.
| | |
|---|---|
| *H05K 1/00* | (2006.01) |
| *G06F 1/16* | (2006.01) |
| *H01L 51/00* | (2006.01) |
| *H01L 27/12* | (2006.01) |

(52) U.S. Cl.
CPC ........ *G06F 1/1652* (2013.01); *H01L 27/1218* (2013.01); *H01L 51/0097* (2013.01)

(58) Field of Classification Search
CPC . G06F 2203/04103; G06F 2203/04105; G06F 3/0412; G06F 3/044; G06F 1/1652; G06F 1/1656; G06F 1/1626; H01L 27/1218; H01L 51/0097; H01L 29/78603
See application file for complete search history.

(56) References Cited

U.S. PATENT DOCUMENTS

| | | | | |
|---|---|---|---|---|
| 2002/0106522 | A1* | 8/2002 | McCormack | ........... B32B 37/26 428/469 |
| 2002/0158298 | A1* | 10/2002 | Yamada | .............. H01L 27/1281 257/471 |
| 2011/0018826 | A1* | 1/2011 | Shoji | ....................... G06F 3/044 345/173 |
| 2011/0157506 | A1* | 6/2011 | Eguchi | .............. G02F 1/133553 349/39 |
| 2015/0102324 | A1* | 4/2015 | Lee | ..................... H01L 27/3244 257/40 |
| 2015/0228704 | A1* | 8/2015 | Miyake | ............... H01L 27/3204 257/40 |
| 2017/0045770 | A1* | 2/2017 | Li | ........................ G02F 1/13338 |
| 2017/0293377 | A1* | 10/2017 | Hsu | .......................... G06F 3/044 |

(Continued)

FOREIGN PATENT DOCUMENTS

| | | |
|---|---|---|
| EP | 0556790 A1 | 8/1993 |
| KR | 10-2015-0043890 A | 4/2015 |

(Continued)

*Primary Examiner* — Yuriy Semenenko
(74) *Attorney, Agent, or Firm* — Kile Park Reed & Houtteman PLLC

(57) ABSTRACT

A display device includes a flexible substrate, a display element on the flexible substrate and including a thin film transistor, a metal layer disposed at a lower portion of the flexible substrate, and an air layer formed between the flexible substrate and the metal layer.

19 Claims, 8 Drawing Sheets

(56) References Cited

U.S. PATENT DOCUMENTS

2017/0352834 A1* 12/2017 Kim .................... H01L 27/3276
2018/0174931 A1* 6/2018 Henley .................. H01L 22/20

FOREIGN PATENT DOCUMENTS

| KR | 10-2016-0006335 A | 1/2016 |
| KR | 10-2016-0091027 A | 8/2016 |
| KR | 10-2017-0037786 A | 4/2017 |
| KR | 10-2017-0123949 A | 11/2017 |

* cited by examiner

DISPLAY DEVICE

CROSS-REFERENCE TO RELATED APPLICATION

Korean Patent Application No. 10-2018-0088583 filed on Jul. 30, 2018, in the Korean Intellectual Property Office, and entitled: "Display Device," is incorporated by reference herein in its entirety.

BACKGROUND

1. Field

Embodiments relate to a display device.

2. Description of the Related Art

A display device serves to display an image, and includes a liquid crystal display, an organic light emitting diode display, and the like.

In general, a liquid crystal display device is mainly used, but recently, an organic light emitting diode display has attracted attention as a display device.

The liquid crystal display generally includes a substrate, and a thin film transistor and a liquid crystal layer on the substrate. The organic light emitting diode display includes a substrate and a thin film transistor in the same manner as the liquid crystal display, but is different from the liquid crystal display in including an organic light emitting element that emits light itself instead of having the liquid crystal layer.

The above information disclosed in this Background section is only for enhancement of understanding of the background of the invention and therefore it may contain information that does not form the prior art that is already known in this country to a person of ordinary skill in the art.

SUMMARY

Embodiments are directed to a display device, including a flexible substrate, a display element on the flexible substrate and including a thin film transistor, a metal layer disposed at a lower portion of the flexible substrate, and an air layer formed between the flexible substrate and the metal layer.

The display device may further include a supporting member disposed between the substrate and the metal layer to support the metal layer.

The supporting member may be formed on a surface of the metal layer facing a surface of the substrate.

The supporting member may include a film and a ball formed inside the film.

Convex portions and concave portions may be formed to be continuous in a surface of the film.

An air layer may be formed on one of between the flexible substrate and the supporting member or between the supporting member and the metal layer.

The film or the ball may include a conductive material.

The display device may further include a barrier layer on the flexible substrate and a buffer layer on the barrier layer. The display element may be on the buffer layer.

The buffer layer or the barrier layer may be formed of at least one of a silicon oxide, a silicon nitride, or an aluminum oxide.

A thickness of the buffer layer may be about 2000 Å, and a thickness of the barrier layer may be about 5000 Å.

The thin film transistor may include a semiconductor layer and a gate electrode on the semiconductor layer.

A first insulating layer may be disposed between the semiconductor layer and the gate electrode.

One end of the metal layer may be connected to a ground electrode.

The flexible substrate may be made of polyimide.

A thickness of the flexible substrate may be in a range of 3 µm to 10 µm.

Embodiments are also directed to a display device, including a flexible substrate, a barrier layer on the flexible substrate, a buffer layer on the barrier layer, a display element including a thin film transistor on the buffer layer, and a high dielectric constant layer disposed between the display element and the flexible substrate.

The high dielectric constant layer may be disposed between the flexible substrate and the barrier layer.

The high dielectric constant layer may be disposed between the barrier layer and the buffer layer.

The thin film transistor may include a semiconductor layer and a gate electrode on the semiconductor layer, and a first insulating layer may be disposed between the semiconductor layer and the gate electrode.

The flexible substrate may be made of polyimide.

BRIEF DESCRIPTION OF THE DRAWINGS

Features will become apparent to those of skill in the art by describing in detail example embodiments with reference to the attached drawings in which.

DETAILED DESCRIPTION

Figure 1:
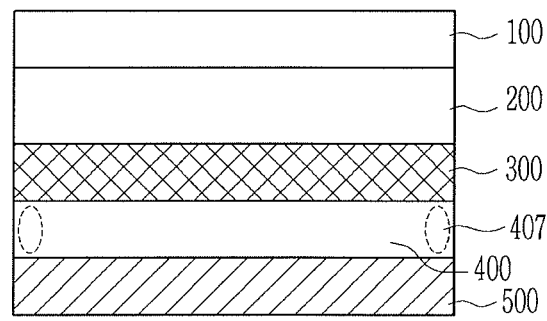
FIG. 1 illustrates a cross-sectional view of a display, device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

Hereinafter, a display device according to an example embodiment will be described with reference to FIG. 1.

FIG. 1 illustrates a cross-sectional view of a display device according to an example embodiment.

Referring to FIG. 1, a display device according to an example embodiment has a structure in which a window 100, a display element 200 including a thin film transistor, a substrate 300, an air layer 400, a supporting member 407, and a metal layer 500 are sequentially stacked.

The window 100 is disposed at an upper portion or exterior portion of the display device to protect various consistent elements disposed at a lower portion thereof. The window 100 is formed of a transparent material to transmit internal light generated inside the display device to the outside so that an image may be visually recognized from the outside. The window 100 may be formed of, e.g., a transparent film, glass, or plastic.

The display element 200 may be disposed under the window 100 and serves as a part for displaying an image on the display device. The display element 200 may include a thin film transistor, e.g., in a pixel circuit, and a display unit connected thereto to display an image. The display unit may be variously implemented by using a liquid crystal layer, an organic light emitting element, or the like. The thin film transistor may receive a voltage to drive the display unit, and at least two thin film transistors may be used to drive the organic light emitting element. A plurality of, e.g., 6 to 8, thin film transistors may be used depending on example embodiments. Further, according to an example embodiment, the thin film transistor may include a driving transistor, a switching transistor, a compensation transistor, an initialization transistor, a light emission control transistor, and the like.

The substrate 300 may be disposed at a lower portion of the display element 200. The substrate 300 may be formed of a flexible material, e.g., a plastic or polyimide (PI).

The air layer 400 may be disposed at a lower portion of the substrate 300, and the metal layer 500 may be located at a lower portion of the air layer 400.

The metal layer 500 may be disposed at a certain distance from the substrate 300. In addition, the metal layer 500 may have a construction, e.g., a sufficiently small thickness, so as to be bent together with the substrate 300 while returning to its original state thereafter. The metal layer 500 may be, e.g., a metal film. The metal layer 500 and the air layer 400 may combine to provide an effective capacitance in which the air layer serves a dielectric, as described below in further detail.

The air layer 400 may be an empty space between the substrate 300 and the metal layer 500. The space of the air layer 400 may be provided by a supporting member 407, which may be formed at opposite ends of the metal layer 500 or at various positions to maintain a distance between the metal layer 500 and the substrate 300. The air layer 400 may be a space excluding the supporting member 407.

A single metal layer 500 may be formed or a plurality of metal layers may be formed, e.g., spaced apart in a direction parallel to an extending direction of the substrate 300. An example embodiment in which the plurality of metal layers is formed will be described in connection with FIG. 2 and FIG. 3.

Figure 2:
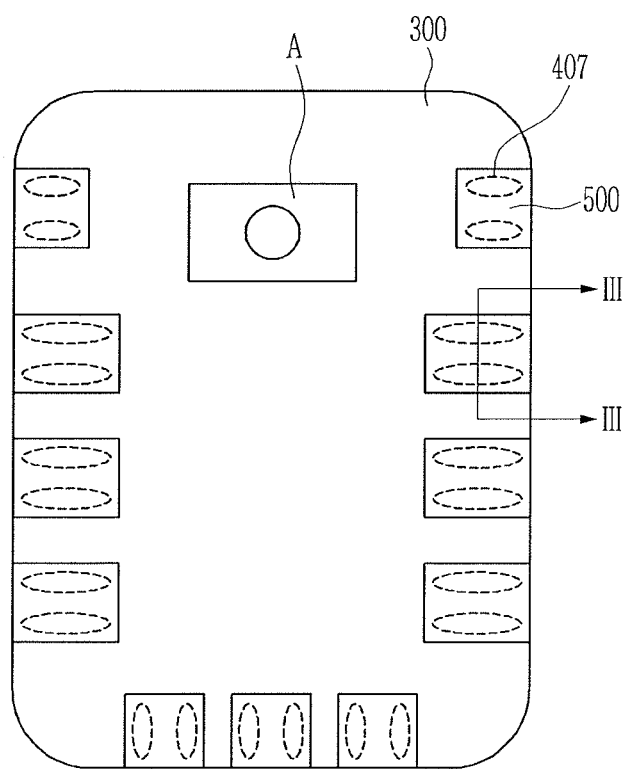
FIG. 2 illustrates a rear view of a display device according to an example embodiment.
Figure 3:
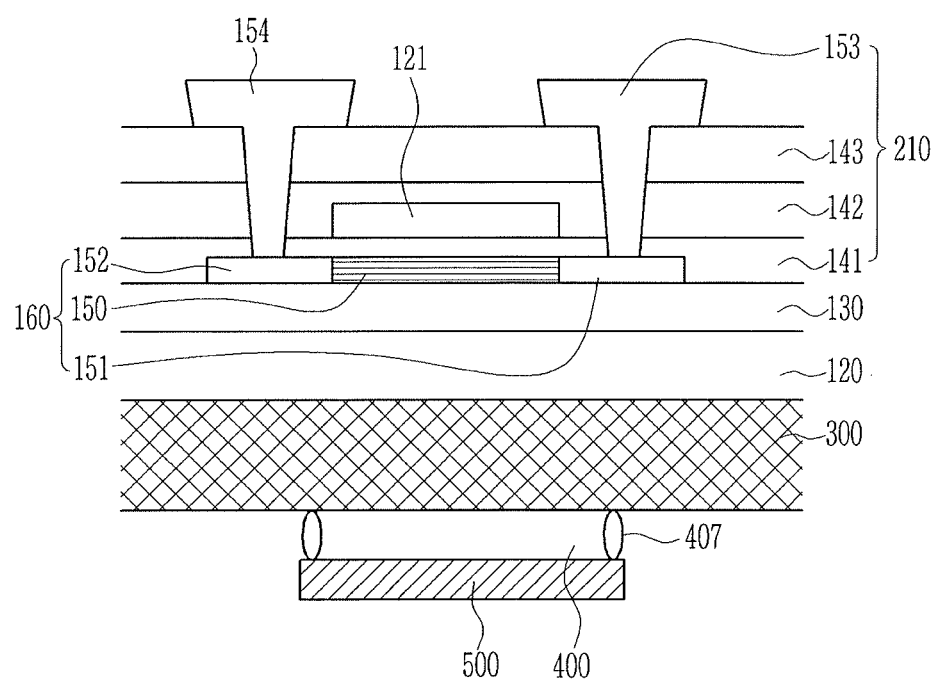
FIG. 3 illustrates a cross-sectional view taken along a line FIG. 2.

FIG. 2 illustrates a rear view of a display device according to an example embodiment, and FIG. 3 illustrates a cross-sectional view taken along a line FIG. 2.

Although the display device illustrated in FIG. 2 is a portable electronic device, it may be applied to various electronic devices such as a TV and a tablet PC according to an example embodiment.

Referring to FIG. 2, the display device according to an example embodiment includes the substrate 300, a plurality of the metal layers 500, and a plurality of the supporting members 407 in a bottom view. The metal layers 500 are on a back side of the substrate 300, and the supporting members 407 are on opposite ends of each of the metal layers 500.

In the present example embodiment, the metal layers 500 are arranged in parallel with an edge of the substrate 300 at a left side of the substrate 300, and are arranged in parallel with an edge of the substrate 300 at a right side of the substrate 300 to face the left side thereof. In addition, the metal layers 500 are arranged in parallel along the edge thereof at a lower end of the substrate 300. Herein, the metal layers 500 are disposed a certain distance apart, and the distance between the metal layers 500 may be constant or not constant.

In addition, the metal layers 500 may not be formed in a space that needs to be allocated for a specific function in a lower portion of the substrate 300. For example, a camera region A is illustrated to show that no metal layer 500 is formed at a position where a camera is disposed, and similar provisions may be provided for areas where various sensors such as a fingerprint sensor (not shown) and a light sensor (not shown) are formed.

In the example embodiment illustrated in FIG. 2, the metal layers 500 are arranged at opposite sides of substrate 300, respectively forming four quadrangles of similar size. A square metal layer 500 (having a length and a width that are similar to each other) is disposed at an uppermost side of each of the opposite sides of the substrate 300, and three rectangular metal layers 500 having a width that is slightly shorter than a length are disposed below the square metal layer 500 at each of the opposite sides of the substrate 300. Additionally, three square metal layers (of similar length and width) are disposed at a lower end of the substrate 300.

The square metal layers 500 may be formed to be, for example, 0.5 cm by 0.5 cm, or smaller. Herein, the metal layers 500 are implemented as a quadrangle, but may be implemented in various shapes such as a circle or a triangle. In addition, the metal layers 500 may be formed with the same shape, size, and shape.

The supporting members 407 are disposed at opposite ends of the metal layer 500 facing the substrate 300. Two supporting members 407 may be formed at opposite ends of each of the metal layers 500, and may be formed by curing a frit or the like.

The two supporting members 407 at opposite ends a metal layer 500 may be spaced a certain distance apart. A number of the supporting members 407 may vary depending on a size and shape of the metal layer 500, and a distance between the supporting members 407 may vary depending on the number of the supporting members 407.

The supporting members 407 may be formed in an elliptical shape having a long width in a width direction of the metal layers 500, or may be formed in various shapes such as a circular shape and a cylindrical shape depending on the size and shape of the metal layers 500.

The supporting members 407 may attach the metal layer 500 to the substrate 300. In an implementation, the substrate 300 and the supporting members 407, and/or the supporting members 407 and the metal layers 500, may be attached to each other by an adhesive such as an anisotropic conductive film (ACF).

The supporting members 407 maintain a constant distance between the substrate 300 and the metal layers 500, such that the air layer 400 is formed in areas of the metal layers 500 that overlap the substrate 300, except at the supporting members 407.

FIG. 2 merely illustrates an example, and the metal layers 500 and the supporting members 407 may be variously arranged under the substrate 300 with different sizes and shapes.

A detailed description will be given in stacking orders in a cross-sectional view of a display device according to an example embodiment with reference to FIG. 3.

FIG. 3 illustrates a cross-sectional view taken along a line FIG. 2.

FIG. 3 will be described in connection with a structure including the thin film transistor 210 included in the display element 200, the substrate 300, the air layer 400, the supporting members 407, and the metal layer 500, while for clarity omitting other elements such as the window 100 in the sectional view of the display device of FIG. 1.

In the present example embodiment, the display device a metal layer 500, an air layer 400, supporting members 407, a substrate 300, a buffer layer 130, and a thin film transistor 210.

The thin film transistor 210 includes a gate electrode 121, a semiconductor layer 160, a first insulating layer 141, a second insulating layer 142, a third insulating layer 143, a source electrode 153, and a drain electrode 154.

Referring to FIG. 3, the metal layer 500 is disposed at a bottom of the substrate 300. The metal layer 500 is disposed at a center of the bottom of the substrate 300 and is formed with a smaller size than the substrate 300. The metal layer 500 may be disposed freely at a lower left or right side of the substrate 300, and may be variously formed in various sizes and shapes depending on a disposition position.

One end of the metal layer 500 may be connected to a ground layer (not shown).

The metal layer 500 may be formed of, e.g., a metal having high thermal conductivity such as aluminum (Al), copper (Cu), silver (Ag), tungsten (W), or gold (Au).

The supporting members 407 may be disposed at opposite ends of the metal layer 500, and is formed between the substrate 300 and the metal layer 500. The supporting members 407 may be formed by curing a frit, an adhesive material, or the like.

The air layer 400 is formed in an internal space between the substrate 300 and the metal layer 500. The air layer 400 may be an inner space of the supporting member 407 disposed at opposite ends of the metal layer 500. A volume of the air layer 400 may vary depending on the size and shape of the metal layer 500.

The substrate 300 is disposed above the air layer 400 and the supporting member 407. The substrate 300 may be made of a flexible material such as plastic or polyimide (PI), and may be formed to have a thickness of, e.g., 3 μm to 10 μm.

In the example embodiment illustrated in FIG. 3, a barrier layer 120 is on the substrate 300, and the buffer layer 130 is on the barrier layer 120. The barrier layer 120 and the buffer layer 130 may include an inorganic insulating material such as a silicon oxide (SiOx), a silicon nitride (SiNx), or an aluminum oxide ($Al_2O_3$), and may also include an organic insulating material such as a polyimide acryl (added with epoxy). Herein, the barrier layer 120 may be formed to have a thickness of, e.g., 5000 Å (0.5 μm), and the buffer layer 130 may be formed to have a thickness of, e.g., 2000 Å (0.2 μm).

A semiconductor layer 160 is on the buffer layer 130. The semiconductor layer 160 includes a channel region 150, a source region 151, and a drain region 152. The semiconductor layer 160 may include a polycrystalline semiconductor such as poly-Si, or an oxide semiconductor.

A first insulating layer 141 covering the semiconductor layer 160 is on the semiconductor layer 160. A gate electrode 121 of the thin film transistor 210 is on the first insulating layer 141. A second insulating layer 142 is on the gate electrode 121 to cover the same, and a third insulating layer 143 is on the second insulating layer 142 to cover the same. The first insulating layer 141, the second insulating layer 142, and the third insulating layer 143 are made of a silicon oxide (SiOx), a silicon nitride (SiNx), an aluminum oxide ($Al_2O_3$), or the like.

The source region 151 and the drain region 152 are connected to electrodes (not shown) of other thin film transistors or data lines (not shown) through contact holes formed through the first insulating film 141, the second insulating film 142, and the third insulating film 143.

Although a display device applied to a portable electronic device has been described with reference to FIG. 2 and FIG. 3, the display device according to an example embodiment can be applied not only to a portable electronic device but also to various other electronic devices.

Hereinafter, a gate voltage that is changed when the display device is driven will be described in detail with reference to FIG. 4, FIG. 5, and FIG. 6.

Figure 4:
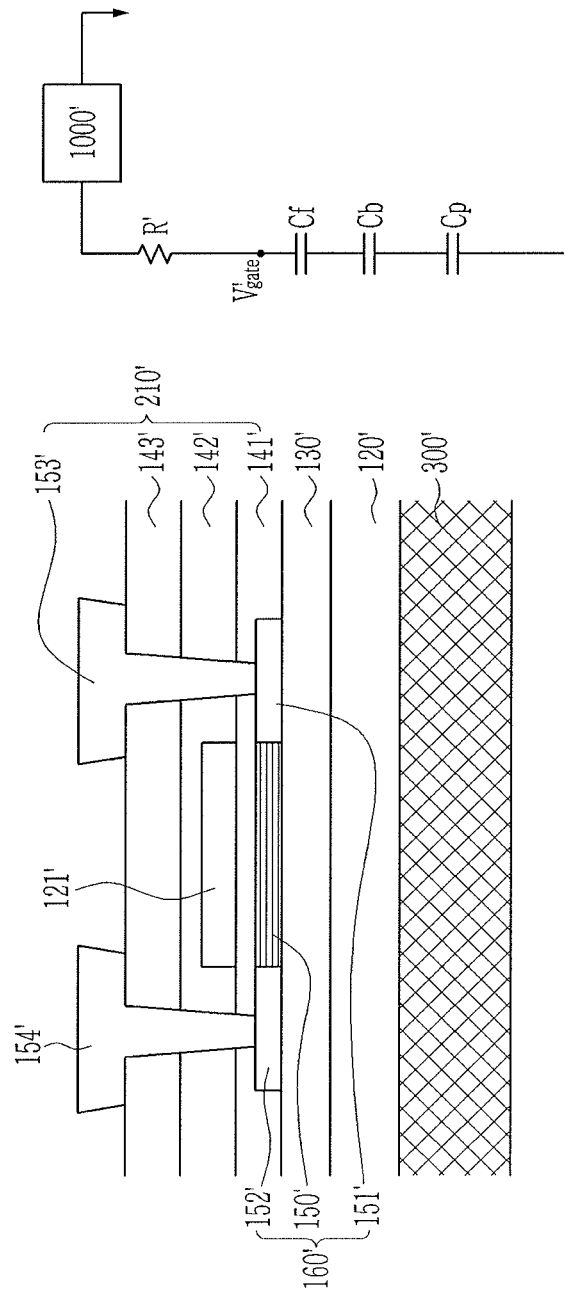
FIG. 4 illustrates a cross-sectional view of the display device according to a comparative example and a corresponding circuit diagram thereof.
Figure 5:
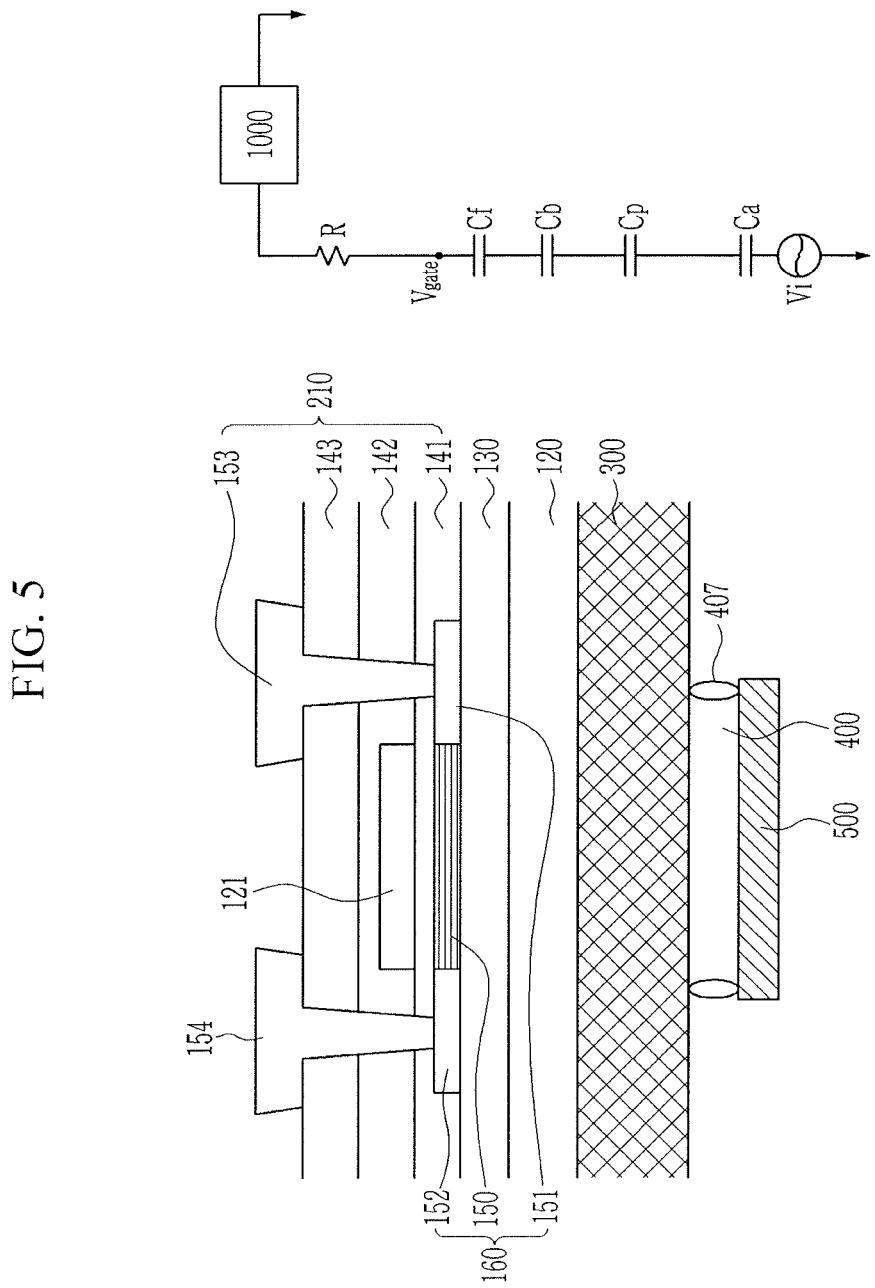
FIG. 5 illustrates a cross-sectional view of FIG. 3 and a corresponding circuit diagram thereof.

FIG. 4 illustrates a cross-sectional view of the display device according to a comparative example and a corresponding circuit diagram thereof, and FIG. 5 illustrates a cross-sectional view of FIG. 3 according to an example embodiment and a corresponding circuit diagram thereof.

Figure 6:
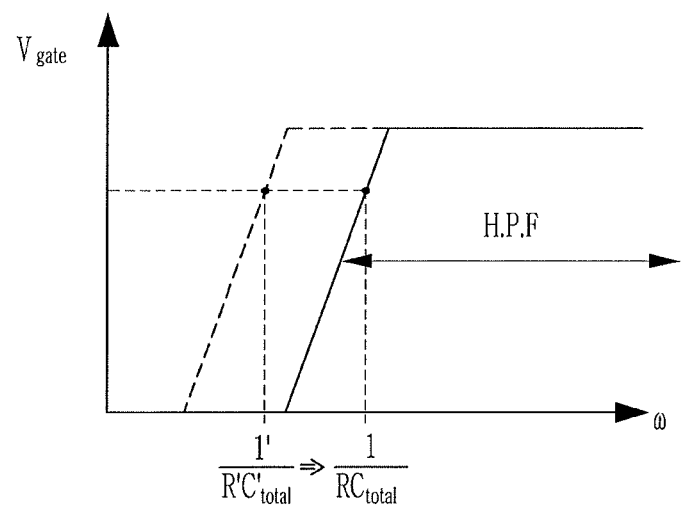
FIG. 6 is a graph illustrating a gate voltage according to a frequency in the circuit diagrams of FIG. 4 and FIG. 5.

FIG. 6 is a graph illustrating a gate voltage according to a frequency in the circuit diagrams of FIG. 4 and FIG. 5.

First, referring to FIG. 4, a display device according to a comparative example includes a substrate 300', a barrier layer 120', a buffer layer 130', and a thin film transistor 210'. Herein, the thin film transistor 210' includes a gate electrode 121', a semiconductor layer 160', a first insulating layer 141', a second insulating layer 142', a third insulating layer 143', a source electrode 153', and a drain electrode 154'.

The substrate 300' may be formed of, e.g., a flexible material such as plastic or polyimide.

In a flexible substrate, when a thin film transistor is driven, a transistor may not be normally driven due to a material of a layered structure disposed at upper and lower portions of the transistor, a movement of charges, and the like.

Hereinafter, factors affecting the transistor driving will be described with reference to the circuit diagram of FIG. 4.

The circuit diagram of FIG. 4 illustrates elements and connection wires corresponding to a cross-sectional view of a display device according to the comparative example. The circuit diagram is intended to describe factors that affect an operation of the transistor 210', based on the gate voltage (V'gate) when the thin film transistor 210' is driven.

The circuit diagram of FIG. 4 shows a gate driver 1000', a resistor R', a capacitor Cf of the buffer layer 130', a capacitor Cb of the barrier layer 120', and a capacitor Cp of the substrate 300'. Herein, the resistor R' represents a resistance of the wire connected between the gate driver 1000' and the thin film transistor 210'. The resistor R' may be determined by a length and cross-section of the wire and resistivity thereof.

In the circuit diagram of FIG. 4, a first end of the gate driver 1000' is connected to a ground power supply and a second end thereof is connected to the resistor R'. The resistor R' is connected between the gate driver 1000' and the capacitor Cf of the buffer layer 130'. The capacitor Cf of the buffer layer 130' is connected to the capacitor Cp of the barrier layer 120' and the capacitor Cp of the substrate 300'. A first end of the capacitor Cp of the substrate 300' may be connected to the capacitor Cb of the barrier layer 120', and a second end may be floated or connected to another constituent element (not shown).

The gate driving unit 1000' alternately applies a gate-on voltage and a gate-off voltage to a gate wire connected to the gate electrode 121' in response to a gate control signal applied from the signal controller (not shown). When a gate-on voltage is applied, the thin film transistor 210' turns on.

When the thin film transistor 210' is turned on, the transistor is driven in response to a gate voltage, a voltage across the gate electrode and the source electrode, and a threshold voltage of the transistor.

After the transistor is turned on, the gate voltage V'gate may be affected by the voltage applied from the gate driver 1000', the resistor R', charges of the buffer layer 130', charges of the barrier layer 120', charges of the substrate 300', and voltages and frequencies of an external power supply (not shown).

Hereinafter, a capacitance of each layer derived from the charges of the buffer layer 130' disposed under the thin film transistor 210', the charges of the barrier layer 120', and the charges of the substrate 300' will be mainly described.

The capacitance of an isolation region such as the buffer layer 130', the barrier layer 120', and the substrate 300' varies depending on a thickness of the region, a dielectric constant of the region, and areas of conductive layers disposed above and below the region. When the areas of the conductive layers are not the same, the smaller conductive layer among the two areas of the conductive layers is related to the capacitance of an isolation region thereto.

The capacitance of each layer may be expressed by an equation $$C = \varepsilon \cdot \frac{A}{d}$$

Specifically, the capacitance $C_f$ of the buffer layer 130' may be expressed by Equation 1.

$$C_f = \varepsilon_o \cdot \varepsilon_f \cdot \frac{A}{d_f} \quad \text{(Equation 1)}$$

Herein, A indicates the area of the buffer layer 130', $d_f$ indicates the thickness of the buffer layer 130', and $\varepsilon_o \cdot \varepsilon_f$ indicates the dielectric constant of the buffer layer 130'.

The capacitance $C_b$ of the barrier layer 120' may be expressed by Equation 2.

$$C_b = \varepsilon_o \cdot \varepsilon_b \cdot \frac{A}{d_b} \quad \text{(Equation 2)}$$

Herein, A indicates the area of the barrier layer 120', $d_b$ indicates the thickness of the barrier layer 120', and $\varepsilon_o \cdot \varepsilon_b$ indicates the dielectric constant of the barrier layer 120'.

The capacitance $C_p$ of the substrate 300' may be expressed by Equation 3.

$$C_p = \varepsilon_o \cdot \varepsilon_p \cdot \frac{A}{d_p} \quad \text{(Equation 3)}$$

Herein, A indicates an overlapped area between the substrate 300' and the barrier layer 120', $d_p$ indicates the thickness of the substrate 300', and $\varepsilon_o \cdot \varepsilon_p$ indicates the dielectric constant of the substrate 300'.

The capacitor Cf of the buffer layer 130', the capacitor Cb of the barrier layer 120', and the capacitor Cp of the substrate 300' are connected in series.

Therefore, a total capacitance $C_{total}'$ of a lower structure of the thin film transistor 210' according to the comparative example of FIG. 4 is as follows.

$$C'_{total} = \varepsilon_o \cdot \frac{A}{\frac{d_f}{\varepsilon_f} + \frac{d_b}{\varepsilon_b} + \frac{d_p}{\varepsilon_p}} \quad \text{(Equation 4)}$$

Hereinafter, factors that affect transistor operation when a thin film transistor is driven in a display device according to an example embodiment will be described with reference to FIG. 5.

FIG. 5 illustrates a cross-sectional view of FIG. 3 and a corresponding circuit diagram thereof.

Referring to FIG. 5, as described in FIG. 3, the display device according to an example embodiment includes a metal layer 500, an air layer 400, a supporting member 407, a substrate 300, a barrier layer 120, a buffer layer 130, and a thin film transistor 210.

The cross-sectional view of FIG. 5 further includes the metal layer 500, the supporting members 407, and the air layer 400, which are not present in the cross-sectional view of FIG. 4.

The circuit diagram of FIG. 5 illustrates elements and connection wires corresponding to a cross-sectional view of the display device according to an example.

The circuit diagram of FIG. 5 illustrates a gate driver 1000, a resistor R, a capacitor of the buffer layer 130, a capacitor of the barrier layer 120, a capacitor of the substrate 300, and a capacitor of the air layer 400.

In the circuit diagram of FIG. 5, a first end of the gate driver 1000 is connected to a ground power supply, and a second end thereof is connected to the resistor R. The resistor R is connected between the gate driver 1000 and the capacitor of the buffer layer 130. The capacitor of the buffer layer 130 is connected to the capacitor of the barrier layer 120, and the capacitor of the barrier layer 120 is connected to a first end of the capacitor of the substrate 300. A second end of the capacitor of the substrate 300 is connected to a first end of the capacitor of the air layer 400, and a second end of the capacitor of the air layer 400 is connected to a ground layer, e.g., the metal layer 500 may be connected to the ground layer via an external power supply Vi.

In the display device according to an example embodiment, similar to FIG. 4, the gate voltage $V_{gate}$ may be affected by the voltage applied from the gate driver 1000, the resistor R, charges of the buffer layer 130, charges of the barrier layer 120, charges of the substrate 300, and voltages and frequencies of an external power supply (not shown).

Hereinafter, a capacitance of each layer derived from the charges of the buffer layer 130 disposed under the thin film transistor 210, the charges of the barrier layer 120, and the charges of the substrate 300 will be mainly described.

The capacitance of the buffer layer 130, the barrier layer 120, and the substrate 300 have the same structures as those of the cross-sectional view of FIG. 4 and the cross-sectional view of FIG. 5, and are the same as those shown in the circuit diagram of FIG. 4.

However, unlike FIG. 4, FIG. 5 reflects the dielectric constant 1 of the air layer 400 because it further includes the air layer 400. However, unlike in FIG. 4, the air layer 400 is further included in FIG. 5, and thus a dielectric constant 1 of the air layer 400 is reflected. An area and distance overlapping the substrate 300 and the metal layer 500 in the capacitance of the air layer 400 do not have a large influence, and the capacitance of the air layer 400 may be approximately 1.

The capacitor Cf of the buffer layer 130, the capacitor Cb of the barrier layer 120, the capacitor Cp of the substrate 300, and a capacitor Ca of the air layer 400 are connected in series.

Therefore, a total capacitance $C_{total}$ of a lower structure of the thin film transistor 210 according to the example of FIG. 5 is as follows.

$$C_{total} = \varepsilon_o \cdot \frac{A}{\frac{d_f}{\varepsilon_f} + \frac{d_b}{\varepsilon_b} + \frac{d_p}{\varepsilon_p} + 1} \quad \text{(Equation 5)}$$

Comparing this with the total capacitance of the transistor under the transistor of $$C'_{total} = \varepsilon_o \cdot \frac{A}{\frac{d_f}{\varepsilon_f} + \frac{d_b}{\varepsilon_b} + \frac{d_p}{\varepsilon_p}}, \quad \text{Equation 4}$$

it is seen that the total capacitance under the transistor according to the example embodiment of FIG. 5 (i.e., FIG. 3) has a smaller value than that of FIG. 4.

Referring again to the circuit diagram of FIG. 4, when the thin film transistor 210' according to the comparative example is driven, the gate voltage V'gate is affected by the resistor R', the capacitor Cf of the buffer layer 130', the capacitor Cb of the barrier layer 120', and the capacitor Cp of the substrate 300'.

On the contrary, in the circuit diagram of FIG. 5, when the thin film transistor 210 according to the example is driven, the gate voltage $V_{gate}$ is further affected by the capacitor Ca of the air layer 400 as well as the resistor R, the capacitor Cf of the buffer layer 130, the capacitor Cb of the barrier layer 120, and the capacitor Cp of the substrate 300.

For the display quality of the display device, it is recognized that when no power is applied thereto, an afterimage does not appear on the display device.

However, even when the power is not applied, a current of the transistor does not become zero, and a residual current appears in the display device. When the power is not applied, a time until the transistor is completely turned off may be estimated from a time constant viewpoint.

Referring to the circuit diagrams of FIG. 4 and FIG. 5, it is possible to infer the time (time constant) until the gate voltage is constantly maintained by applying an external voltage to the circuit in which the resistor R and the capacitor C are connected in series. The time constant of the circuit in which the resistor R and the capacitor C are coupled in series may be estimated by 1/RC.

The time constant of the circuit diagram of FIG. 4 is $1/(R'C'_{total})$. In other words, R' denotes a resistance of a wire connected between the gate driver 1000' and the thin film transistor 210', and $C'_{total}$ indicates the total capacitance of the lower structure of the thin film transistor 210' of the comparative example.

The time constant of the circuit diagram of FIG. 5 is $1/(RC_{total})$. In other words, R denotes a resistance of a wire connected between the gate driver 1000 and the thin film transistor 210, and $C_{total}$ indicates the total capacitance of the lower structure of the thin film transistor 210 of the example.

Comparing $1/(R'C'_{total})$ of FIG. 4 with $1/(RC_{total})$ of FIG. 5, FIG. 4 and FIG. 5 have the same resistance. However, since $C_{total}$ of FIG. 5 has a smaller capacitance than $C'_{total}$ of FIG. 4, it is seen that the time constant of FIG. 4 is greater. As a result, in the display device of the comparative example of FIG. 4, a longer time for the gate voltage of the thin film transistor to reduce to zero is maintained when the power is not applied, resulting in a longer afterimage.

Hereinafter, a change in a gate voltage depending on a frequency region will be described with reference to FIG. 6.

FIG. 6 is a graph illustrating a gate voltage according to a frequency in the circuit diagrams of FIG. 4 and FIG. 5.

Referring to the graph of FIG. 6, a dotted line shows an operation of the gate voltage of the display device of the comparative example in FIG. 4, and a solid line shows an operation of the gate voltage of the display device of the example of FIG. 5.

First, referring to the circuit diagram of FIG. 5, it is assumed that the capacitor Ca of the air layer 400 is connected to the ground layer through the external power supply Vi.

In the circuit diagram in which the resistor R and the capacitor $C_{total}$ are coupled in series, when the transistor is driven, the gate voltage Vgate may be expressed in the frequency band as follows.

$$V_{gate} = V_i \cdot \frac{1}{1 + \frac{1}{j\omega RC_{total}}} \quad \text{(Equation 6)}$$

Referring again to FIG. 6, when the transistor is driven, the gate voltage Vgate operates as a high pass filter according to the frequency. Herein, the cut-off frequency, which is a 3 dB value of the gate voltage Vgate, is referred to as a first frequency or a second frequency.

The first frequency of FIG. 5 is $1/RC_{total}$, and the second frequency of FIG. 4 is $1/(R'C'_{total})$.

The gate voltage Vgate linearly increases in proportion to a magnitude of the frequency ω in a smaller frequency band than the first frequency ($1/RC_{total}$) based on the first frequency ($1/RC_{total}$) of FIG. 5. The gate voltage Vgate is constantly maintained in a greater frequency band than the first frequency ($1/RC_{total}$). It is seen that a high-pass filter is effectively present, even based on the second frequency of FIG. 4.

The second frequency $1/R'C'_{total}$ according to the comparative example is smaller than the first frequency $1/RC_{total}$ according to the example. As a result, a greater gate voltage Vgate is applied in a low frequency band in the comparative example of FIG. 4 than in the example of FIG. 5.

The gate voltage Vgate applied in the low frequency band may include a large amount of noise. In such a case, a gate voltage Vgate including a lot of noise may affect the driving of the transistor so as to deteriorate the display quality, e.g., by inducing an afterimage. However, the first frequency according to the example of FIG. 5 is greater than the second frequency according to the comparative example of FIG. 4. The gate voltage Vgate of the low frequency band is less applied than that of the comparative example, and since the transistor is driven by a signal with relatively lower noise, the afterimage may be ameliorated, thereby improving the display quality.

A cut-off frequency at a high level may be used to prevent noise in the low-frequency signal band from passing through the gate voltage, in order to ameliorate the afterimage of the display device. This effect may be realized using the structure in which the air layer 400 is formed between the substrate 300 and the metal layer 500 of the display device according to the example of FIG. 5. Another structure may be provided to form the air layer 400 in addition to the structures illustrated in FIG. 1 to FIG. 3 and FIG. 5.

Figure 7:
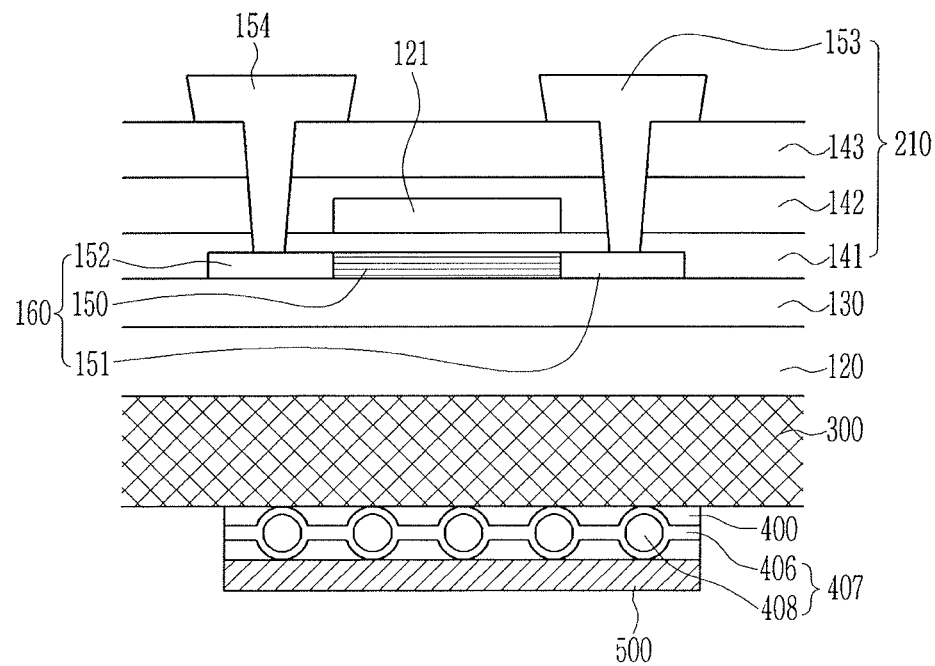
FIG. 7 illustrates a cross-sectional view of a display device according to an example embodiment.

FIG. 7 shows a display device according to an example embodiment which can exhibit the same effect.

Hereinafter, a display device according to an example embodiment capable of exhibiting the same effect will be described with respect to FIG. 7.

FIG. 7 illustrates a cross-sectional view of a display device according to an example embodiment.

Referring to FIG. 7, the display device according to an example embodiment includes the metal layer 500, the air layer 400, a film 406, balls 408, the substrate 300, the buffer layer 130, and the thin film transistor 210.

The thin film transistor 210 includes the gate electrode 121, the semiconductor layer 160, the first insulating layer 141, the second insulating layer 142, the third insulating layer 143, the source electrode 153, and the drain electrode 154.

Comparing the present example embodiment with the display device according to the example embodiment of FIG. 3, the display device of FIG. 7 has a same structure in the substrate 300, the barrier layer 120, the buffer layer 130, and the thin film transistor 210, and thus a description thereof will be omitted.

Referring to FIG. 7, the film 406 and the balls 408 are disposed at a bottom portion of the substrate 300 such that, for example, the film 406 includes a plurality of balls 408 therein to maintain a constant distance between the substrate 300 and the metal layer 500 together with the balls 408. Herein, the film 406 and the balls 408 are examples of the supporting member 407.

In the example embodiment illustrated in FIG. 7, the film 406 includes unevenness or irregularities on opposite sides of the surface. A portion of the film 406 where the balls 408 are disposed is convex, and the remaining portion of the film 406 without the balls 408 is concave. Herein, the film 406 may be a film in which both convex portions and concave portions are continuous, or one side may be a flat surface filled with a concave portion, and the convex portion and the concave portion may be formed on the other side thereof.

The film 406 may be made of a material having adhesion, and may be implemented as a conductive film, an insulating film, a protective film, or the like. The balls 408 may be made of a material having conductivity, and may be implemented as conductive balls or the like.

The film 406 may be variously formed to have a size corresponding to the substrate 300, and the balls 408 may be formed in various sizes in a range that is thinner than the overall thickness of the film 406.

The metal layer 500 is disposed below the film 406, and may be positioned such that a side of the film 406 and a side of the metal layer 500 are aligned along a line normal to the substrate 300. The metal layer 500 may be formed to have a similar size to that of the film 406. However, when the metal layer 500 is smaller, e.g., in a lateral dimension, than the film 406, the metal layer 500 may be disposed anywhere below the film 406.

One end of the metal layer 500 may be connected to a ground layer (not shown).

The air layer 400 is formed in a concave portion between a lower portion of the substrate 300 and the film 406. The air layer 400 is also formed at the concave portion between the metal layer 500 and the film 406. A volume of the air layer 400 may vary depending on the size and shape of the metal layer 500.

A protective film, a plurality of conductive films, etc. may be formed between the substrate 300 and the metal layer 500 in addition to the film 406.

In the display device according to an example embodiment, the air layer 400 is formed under the substrate 300, so that a total capacitance of a lower structure of the transistor is reduced.

As a result, as the total capacitance under the transistor decreases, the gate voltage of the low frequency band including noise in the frequency region may be filtered.

In addition, since charges under the transistor do not move to the transistor, the transistor may operate normally, and a display device having ameliorated afterimage and improved display quality may be implemented.

This effect is caused by a structure in which the air layer and the metal layer are sequentially formed under the substrate. In the meantime, a degree of afterimage amelioration may vary depending on a distance between the substrate 300 and the metal layer 500.

Hereinafter, an afterimage effect according to the distance between the substrate 300 and the metal layer 500 will be described with reference to FIG. 8.

Figure 8:
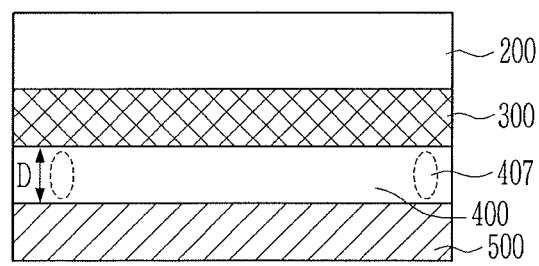
FIG. 8 illustrates a cross-sectional view of a display device according to an example embodiment.

FIG. 8 illustrates a cross-sectional view of a display device according to an example embodiment.

Referring to FIG. 8, the display device according to an example embodiment has a structure in which the display element 200 including the thin film transistor, the substrate 300, the air layer 400, the supporting members 407, and the metal layer 500 are sequentially stacked.

FIG. 8 is for describing an afterimage amelioration index according to the distance between the substrate 300 and the metal layer 500, which is an approximate structure excluding the window 100 at an upper portion thereof, and comparing it with the cross-sectional view of the display device according to the example embodiment of FIG. 1.

Since the description related to the display element 200 including the thin film transistor of FIG. 8, the substrate 300, the air layer 400, the supporting member 407, and the metal layer 500 is the same as that of FIG. 1, it will be omitted.

Hereinafter, the afterimage amelioration index according to the distance between the substrate 300 and the metal layer 500 will be described in detail.

The air layer 400 is formed as an empty space between the substrate 300 and the metal layer 500. The space in which the air layer 400 is disposed is supported by the supporting members 407, and the supporting member 407 may be formed at opposite ends of the metal layer 500 or at various positions to maintain a distance between the metal layer 500 and the substrate 300. Thus, the air layer 400 is formed in a space excluding the supporting member 407.

An effect of a layered structure under the transistor on the transistor varies through the air layer 400 formed along the distance between the substrate 300 and the metal layer 500. This effect may be recognized through an afterimage index.

Herein, the afterimage index indicates that an afterimage appears on the display device by the transistor that is driven even when no voltage is applied thereto, and a higher afterimage is disadvantageous.

Hereinafter, an afterimage index according to the distance between the substrate 300 and the metal layer 500 will be described with reference to Table 1.

TABLE 1

| Thickness of substrate | 3 μm | 5 μm | 10 μm |
|---|---|---|---|
| Distance between substrate and metal layer | 1.0 μm or more 1.6 μm or less | 1.6 μm or more 3.2 μm or less | 3.2 μm or more |
| Afterimage index | 0.62 | 0.50 | 0.36 |

The thickness of the substrate 300 may be formed in a range of, e.g., 3 μm to 10 μm.

When the thickness of the substrate 300 is 3 μm and the distance between the substrate 300 and the metal layer 500 is 1.0 μm or more and 1.6 μm or less, the afterimage index is 0.62.

When the thickness of the substrate 300 is 5 μm and the distance between the substrate 300 and the metal layer 500 is 1.6 μm or more and 3.2 μm or less, the afterimage index is 0.50.

When the thickness of the substrate 300 is 10 μm and the distance between the substrate 300 and the metal layer 500 is 3.2 μm or more, the afterimage index is 0.36.

As can be seen with reference to Table 1, as the distance between the substrate 300 and the metal layer 500 increases, the afterimage is ameliorated. The increasing thickness of the substrate 300 also improves the afterimage.

In the recent trend of realizing a slim display device, the thickness of the substrate is also reduced. Therefore, it may be appropriate to form the substrate 300 thickness from 5 μm to 10 μm and to secure the thickness of the substrate 300 and the metal layer 500 from 1.6 μm to 3.2 μm, in order to ameliorate the afterimage by appropriately adjusting the distance between the substrate 300 and the metal layer 500 while maintaining an appropriate thickness of the substrate 300.

As described above, in the display device according to an example embodiment, the air layer 400 and the metal layer 500 are sequentially formed at the lower portion of the substrate 300, to reduce the total capacitance of the lower portion of the transistor. As a result, as the capacitance under the transistor decreases, the gate voltage of the low frequency band including noise in the frequency region may be filtered.

In addition, since charges under the transistor may be prevented from moving to the transistor, the transistor may operate normally, and a display device having ameliorated afterimage and improved display quality may be implemented.

Hereinafter, a rear view of the display device according to an example embodiment will be further described with reference to FIGS. 9A, 9B, and 9C in order to implement a display device with ameliorated afterimage and display quality.

Figure 9A:
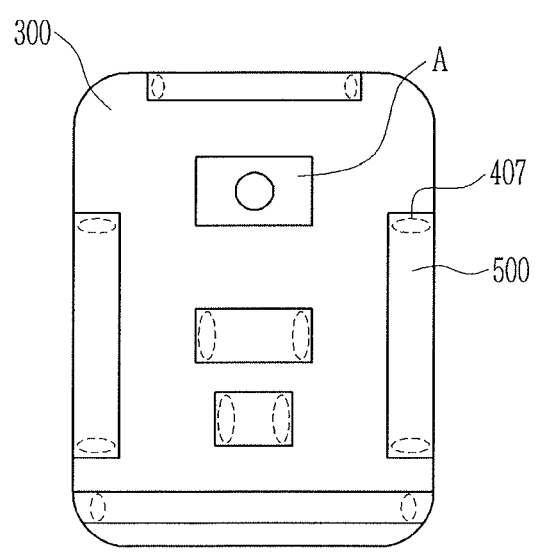
FIGS. 9A, 9B, and 9C illustrate rear views of a display device according to an example embodiment.
Figure 9B:
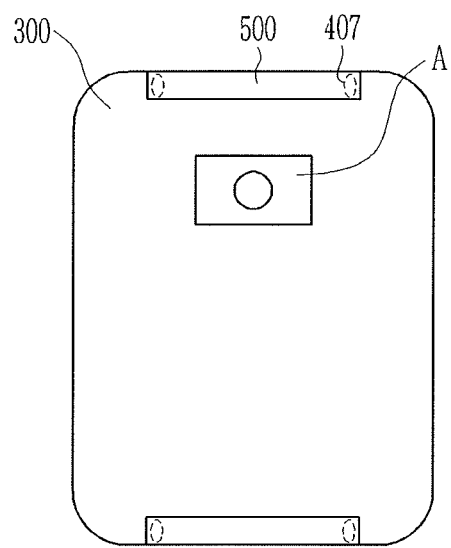
Figure 9C:
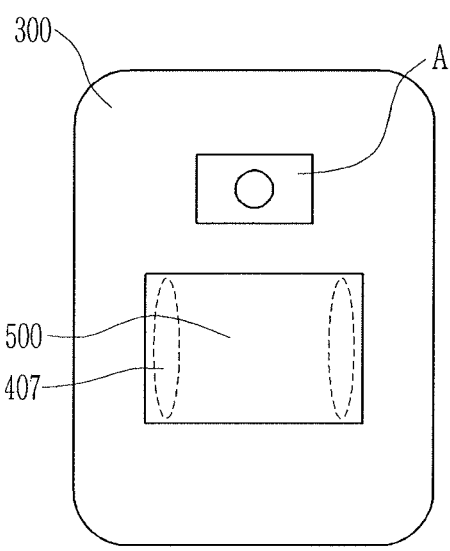

FIGS. 9A, 9B, and 9C illustrate rear views of a display device according to example embodiments.

Referring to FIGS. 9A, 9B, and 9C, the display device according to example embodiments includes the substrate 300, the metal layers 500, and the supporting members 407 in a bottom view. The metal layers 500 are on a back side of the substrate 300, and the supporting members 407 are on opposite ends of each of the metal layers 500.

First, referring to FIG. 9A, respective metal layers 500 are arranged in parallel with an edge of the substrate 300 at a left side and a right side of the substrate 300, in parallel with an edge of the substrate 300 at an upper end of the substrate 300, and at a lower end of the substrate 300 while maintaining a distance slightly away from an edge of the lower end of the substrate 300 such that a side surface of the metal layer 500 is positioned to touch left and right sides of the substrate 300. In addition, two metal layers 500 are disposed between the metal layer 500 on the lower end and the side surface of the camera region A of the substrate 300.

One metal layer 500 arranged on each of the upper end, lower end, and left and right sides of the substrate 300, each having a rectangular shape having a greater length than a width thereof. Two metal layers 500 are disposed between the metal layer 500 on the lower end and the side surface of the camera region A of the substrate 300. The two metal layers 500 that are disposed at the lower end and the side surface of the camera region of the substrate 300 are rectangular having different sizes.

Herein, the metal layers 500 are implemented as a quadrangle, but may be implemented in various shapes such as a circle or a triangle.

A supporting member 407 is formed at opposite ends of each metal layer 500. A number of the supporting members 407 may vary depending on a size and shape of the metal layer 500, and a distance between the supporting members 407 may vary depending on the number of the supporting members 407.

Next, referring to FIG. 9B, one metal layer 500 is arranged in parallel with an edge of the substrate 300 at an upper side of the substrate 300, and is arranged in parallel with an edge of the substrate 300 at a position to face the upper end of the substrate 300.

Similarly, two supporting members 407 are formed at opposite ends of each metal layer 500.

Finally, referring to FIG. 9C, a metal layer 500 is disposed to be spaced a certain distance downward from the camera region A of the substrate 300. One metal layer 500 may be largely formed over a lower region of the substrate 300. Two supporting members 407 are formed on opposite ends of the metal layer 500.

The display device may be formed to ameliorate an afterimage by forming the air layer 400 by attaching the metal layer 500 to the lower portion of the substrate 300 has been described above. The capacitance of the lower portion of the transistor may be reduced by stacking a substance having a high dielectric constant between the transistor and the substrate.

Hereinafter, a display device capable of ameliorating an afterimage in accordance with a layered structure formed of a material having a large dielectric constant according to another example embodiment will be described.

Figure 10:
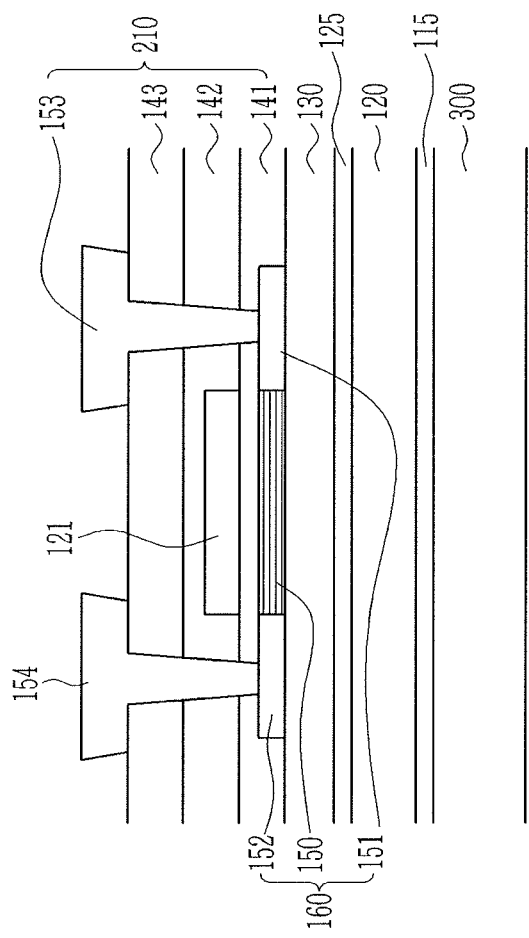
FIG. 10 illustrates a cross-sectional view of a display device according to an example embodiment.

FIG. 10 illustrates a cross-sectional view of a display device according to an example embodiment.

The display device according to an example embodiment of FIG. 10 includes the substrate 300, the first high dielectric constant layer 115, the barrier layer 120, the second high dielectric constant layer 125, the buffer layer 130, and the thin film transistor 210.

The thin film transistor 210 includes the gate electrode 121, the semiconductor layer 160, the first insulating layer 141, the second insulating layer 142, and the third insulating layer 143.

The substrate 300 is disposed at a lower portion of the display device. The substrate 300 may be formed of, e.g., a flexible material such as plastic or polyimide (PI).

The barrier layer 120 is on the substrate 300, and the first high dielectric constant layer 115 is disposed between the substrate 300 and the barrier layer 120. The first high dielectric constant layer 115 may be made of germanium (Ge), carbon nanotubes (C), Teflon, or polyethylene terephthalate (PET).

The barrier layer 120 on the first high dielectric constant layer 115 may include an inorganic insulating material such as a silicon oxide (SiOx), a silicon nitride (SiNx), or an aluminum oxide ($Al_2O_3$), and may also include an organic insulating material such as polyimide acryl (added with epoxy).

The second high dielectric constant layer 125 is on the barrier layer 120. The second high dielectric constant layer 125 may be made of germanium (Ge), carbon nanotubes (C), Teflon, or polyethylene terephthalate (PET).

The buffer layer 130 may be on the second high dielectric constant layer 125, may include an inorganic insulating material such as a silicon oxide (SiOx), a silicon nitride (SiNx), or an aluminum oxide ($Al_2O_3$), and may also include an organic insulating material such as polyimide acryl (added with epoxy).

In a flexible substrate, when a thin film transistor is driven, a transistor may not be normally driven due to a material of a layered structure disposed at upper and lower portions of the transistor, a movement of charges, and the like.

Therefore, the display device according to an example embodiment of FIG. 10 includes the first high dielectric constant layer 115 and the second high dielectric constant layer 125 in the lower structure of the transistor to reduce this problem.

When the transistor is driven, the buffer layer 130, the barrier layer 120, and the substrate 300 disposed under the transistor may function as a capacitor, depending on charges of the buffer layer 130, charges of the barrier layer 120, and charges of the substrate 300.

The insulating regions such as the buffer layer 130, the barrier layer 120, and the substrate 300 have different capacitances depending on a thickness of the region, a dielectric constant of the region.

However, the material constituting the first high dielectric constant layer 115 and the second high dielectric constant layer 125 corresponds to a material having a high dielectric dissipation factor, i.e., a material having high resistivity.

Therefore, according to an example embodiment, total capacitance is reduced by increasing resistivity of the lower structure of the transistor in the display device in which the substrate 300, the first high dielectric constant layer 115, the barrier layer 120, the second high dielectric constant layer 125, the buffer layer 130 are sequentially stacked.

Herein, if only the first high dielectric constant layer 115 exists or only the second high dielectric constant layer 125 exists, the total capacitance of the lower portion of the transistor may be reduced, and thus at least one of the first high dielectric constant layer 115 and the second high dielectric constant layer 125 may be omitted. In addition, the total capacitance of the lower portion of the transistor can be reduced by increasing the thickness of the buffer layer 130 or the barrier layer 120.

As a result, as the total capacitance under the transistor decreases, the gate voltage of the low frequency band including noise in the frequency region may be filtered.

In addition, since charges under the transistor may be prevented from moving to the transistor, the transistor may operate normally, and a display device having ameliorated afterimage and improved display quality may be implemented.

By way of summation and review, flexible substrates may be made of, e.g., plastic or polyimide (PI) for use in flexible products. In a flexible display device, display quality deterioration such as noise signal transmission in a low frequency band at a gate voltage of a thin film transistor or after-image may occur due to the use of a flexible substrate such a plastic substrate.

As described above, embodiments relate to a display device including a flexible substrate.

Embodiments may provide a flexible display device with ameliorated afterimages and improved display quality by adjusting total capacitance of a transistor lower structure.

According to example embodiments, an air layer and a metal layer are sequentially formed under the substrate, so as to reduce a total capacitance of the lower portion of a transistor. As a result, as the capacitance under the transistor decreases, signals of the low frequency band including noise in the frequency region may be filtered. In addition, since charges under the transistor may be prevented from moving to the transistor, the transistor may operate normally, and a display device having ameliorated afterimage and improved display quality may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

| | |
|---|---|
| 100: window, | 1000, 1000': gate driver |
| 120, 120': barrier layer | 121, 121': gate electrode |
| 115: first high dielectric constant layer | |
| 125: second high dielectric constant layer | |
| 130, 130': buffer layer | 141, 141': first insulating layer |
| 142, 142': second insulating layer | |
| 143, 143': third insulating layer | |
| 150, 150': channel region | 151, 151': source region |
| 152, 152': drain region | 153, 153': source electrode |
| 154, 154': drain electrode | 160, 160': semiconductor |
| 200: display element | 210, 210': thin film transistor |
| 300, 300': substrate | 400: air layer |
| 406: film | 407: supporting member |
| 408: ball | 500: metal layer |

What is claimed is:

1. A display device, comprising:
a flexible substrate;
a display element on the flexible substrate and including a thin film transistor;
a metal layer disposed at a lower portion of the flexible substrate;
an air layer formed between the flexible substrate and the metal layer; and
a supporting member disposed between the substrate and the metal layer to support the metal layer.

2. The display device as claimed in claim 1, wherein the supporting member is formed on a surface of the metal layer facing a surface of the substrate.

3. The display device as claimed in claim 1, wherein the supporting member includes:
a film, and
a ball formed inside the film.

4. The display device as claimed in claim 3, wherein convex portions and concave portions are formed to be continuous in a surface of the film.

5. The display device as claimed in claim 3, wherein an air layer is formed on one of between the flexible substrate and the supporting member or between the supporting member and the metal layer.

6. The display device as claimed in claim 3, wherein the film or the ball includes a conductive material.

7. The display device as claimed in claim 1, further comprising:
a barrier layer on the flexible substrate, and
a buffer layer on the barrier layer, wherein the display element is on the buffer layer.

8. The display device as claimed in claim 7, wherein the buffer layer or the barrier layer includes at least one of a silicon oxide, a silicon nitride, or an aluminum oxide.

9. The display device as claimed in claim 7, wherein a thickness of the buffer layer is 2000 Å, and a thickness of the barrier layer is 5000 Å.

10. The display device as claimed in claim 1, wherein the thin film transistor includes a semiconductor layer and a gate electrode on the semiconductor layer.

11. The display device as claimed in claim 10, wherein a first insulating layer is disposed between the semiconductor layer and the gate electrode.

12. The display device as claimed in claim 1, wherein one end of the metal layer is connected to a ground electrode.

13. The display device as claimed in claim 1, wherein the flexible substrate includes polyimide.

14. The display device as claimed in claim 1, wherein a thickness of the flexible substrate is in a range of 3 μm to 10 μm.

15. A display device, comprising:
a flexible substrate including a plastic or polyimide;
a barrier layer on the flexible substrate;
a buffer layer on the barrier layer;
a display element including a thin film transistor on the buffer layer; and
a high dielectric constant layer disposed between the display element and the flexible substrate, wherein
no metal layer exists between the buffer layer and the flexible substrate directly under the thin film transistor, and
wherein the high dielectric constant layer is made of at least one of germanium, carbon nanotubes, and Teflon.

16. The display device as claimed in claim 15, wherein the high dielectric constant layer is disposed between the flexible substrate and the barrier layer.

17. The display device as claimed in claim 15, wherein the high dielectric constant layer is disposed between the barrier layer and the buffer layer.

18. The display device as claimed in claim 15, wherein the flexible substrate includes polyimide.

19. The display device as claimed in claim 15, wherein:
the barrier layer is made of an electrically insulating material,
the buffer layer is made of an electrically insulating material, and
the high dielectric constant layer is disposed between the barrier layer and the buffer layer.

* * * * *